United States Patent
Tachibana et al.

(10) Patent No.: US 7,285,479 B2
(45) Date of Patent: Oct. 23, 2007

(54) SEMICONDUCTOR DEVICE AND METHOD FOR MANUFACTURING MULTILAYERED SUBSTRATE FOR SEMICONDUCTOR DEVICE

(75) Inventors: Takeshi Tachibana, Kobe (JP); Kazushi Hayashi, Kobe (JP); Yoshihiro Yokota, Kobe (JP); Koji Kobashi, Kobe (JP); Takashi Kobori, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 66 days.

(21) Appl. No.: 11/328,162

(22) Filed: Jan. 10, 2006

(65) Prior Publication Data

US 2006/0175293 A1 Aug. 10, 2006

(30) Foreign Application Priority Data

Feb. 9, 2005 (JP) ............................. 2005-033672

(51) Int. Cl.
  *H01L 21/78* (2006.01)
  *H01L 21/301* (2006.01)
  *H01L 21/46* (2006.01)
(52) U.S. Cl. ...................... 438/460; 438/461; 438/462; 438/463; 438/464
(58) Field of Classification Search ...................... None
  See application file for complete search history.

(56) References Cited

U.S. PATENT DOCUMENTS

| | | | | |
|---|---|---|---|---|
| 4,169,337 A | * | 10/1979 | Payne | .......................... 451/41 |
| 5,131,963 A | | 7/1992 | Ravi | |
| 5,366,923 A | * | 11/1994 | Beyer et al. | ................. 438/406 |
| 5,552,345 A | * | 9/1996 | Schrantz et al. | ............ 438/460 |
| 2006/0216514 A1 | * | 9/2006 | Fujimura et al. | ........... 428/408 |

* cited by examiner

*Primary Examiner*—Duy-Vu N Deo
(74) *Attorney, Agent, or Firm*—Reed Smith LLP; Stanley P. Fisher, Esq.; Juan Carlos A. Marquez, Esq.

(57) ABSTRACT

A method for manufacturing a multilayered substrate for a semiconductor device, as well as a semiconductor device, is provided, the multilayered substrate exhibiting an excellent thermal conduction property and an excellent heat spreading effect without occurrence of warp and deformation. A diamond layer is formed through vapor phase deposition on one principal surface of a first silicon substrate by a CVD method. A $SiO_2$ layer is formed on this diamond layer. A $SiO_2$ layer is formed on a surface of a second silicon substrate by a thermal oxidation method. The diamond layer is bonded to the second silicon substrate with $SiO_2$ layers disposed on both the diamond layer and the second silicon substrate therebetween. The first silicon substrate is removed by dissolution through etching to expose the surface of the diamond layer. A silicon layer serving as a semiconductor layer is formed on the diamond layer by a CVD method.

5 Claims, 6 Drawing Sheets

SEMICONDUCTOR DEVICE AND METHOD FOR MANUFACTURING MULTILAYERED SUBSTRATE FOR SEMICONDUCTOR DEVICE

BACKGROUND OF THE INVENTION

1. Field of the Invention

The present invention relates to a method for manufacturing a multilayered substrate, in which a silicon layer is overcoated with diamond, or a diamond layer is overcoated with silicon, for a semiconductor device, as well as a semiconductor device including the multilayered substrate produced by the above-described method.

2. Description of the Related Art

A diamond produced by vapor-phase synthesis on a wafer-shaped substrate made of silicon or the like has a thermal conductivity about 5 times larger than that of copper at room temperature, and is expected to be used as an ultimate heat spreader in a semiconductor device field in which an increase in packaging density and operation frequency have progressed significantly.

In order to take advantage of an excellent thermal conduction property of diamond in a semiconductor device, it is desirable to have a configuration in which a semiconductor layer and a diamond layer are adhered to each other and the thermal conductivity across the adhered interface is high, that is, a multilayered structure composed of the diamond layer and the semiconductor layer, wherein the semiconductor layer is made of various semiconductor materials, for example, silicon, SiGe, silicon carbide, nitride semiconductors, e.g., gallium nitride, gallium arsenide based semiconductors, and group II to group VI semiconductors.

However, it is not easy to produce a diamond/semiconductor multilayered substrate for a semiconductor device. This is because the diamond is usually produced by vapor-phase synthesis at a high temperature of about 800° C. and, thereby, the multilayered substrate is warped and deformed significantly due to a stress resulting from the difference between thermal expansion coefficients of silicon and diamond when the temperature of the multilayered substrate after formation of the diamond layer is returned to room temperature in the case where a semiconductor layer is formed from silicon. A substrate exhibiting such a warp and/or deformation is not suitable for a substrate to be used for a semiconductor device.

Other reasons include that the diamond is an extremely hard material and, therefore, is resistant to being cut when individual elements are separated after a plurality of elements are formed on the multilayered substrate. Furthermore, a surface of diamond produced by vapor-phase synthesis generally has significant roughness and, therefore, the diamond is unsuitable for a substrate to be used for a semiconductor device. Although it is technically possible to flatten the diamond layer surface by polishing, such surface processing is not practical since a long time is required.

Consequently, in order to suppress the warp and deformation of the substrate, a method in which a diamond layer is formed locally in only a specific region on a semiconductor layer, a method in which silicon layers are formed locally on a support and a diamond layer is formed between individual silicon layers (refer to U.S. Pat. No. 5,131,963), and the like have been proposed previously. FIGS. 7A to 7E are sectional views showing the method for manufacturing a multilayered substrate in order of the procedure described in U.S. Pat. No. 5,131,963. The method for manufacturing a multilayered substrate described in U.S. Pat. No. 5,131,963 is a method developed from a method for manufacturing a silicon on insulator (SOI) substrate. As shown in FIG. 7A, a high concentration of B is diffused on one surface of a second silicon substrate 110 to form an etch-stop layer 111. As shown in FIG. 7B, silicon is epitaxially grown on this etch-stop layer 111 to form a silicon layer 112 and, thereafter, a diamond layer 113 is formed thereon. If necessary, as shown in FIG. 7C, a polycrystalline silicon layer 114 serving as a support layer is further formed on the diamond layer 113. Subsequently, as shown in FIG. 7D, the silicon substrate 110 is removed by wet etching. As shown in FIG. 7E, the etch-stop layer 111 is removed by ion etching or the like, so that a diamond/silicon multilayered substrate 100 is produced.

However, the above-described known technologies have the following problems. In the method for manufacturing the multilayered substrate described in U.S. Pat. No. 5,131,963, since a chemical vapor deposition (CVD) step of the diamond is conducted at a high temperature of about 800° C., there is a problem in that the silicon layer 112 is contaminated by heavy metals, alkali metals, and the like. Therefore, the method is not suitable for a substrate to be used for a semiconductor device.

This contamination problem of silicon layer can be avoided by applying a bonding technology used in a method for manufacturing an SOI substrate. However, in this method as well, there are problems in that it is extremely difficult to control the process for removing the silicon substrate by polishing or dissolution after bonding, and it is difficult to leave a uniform and thin-film shaped silicon layer. The method for manufacturing a diamond/silicon multilayered substrate, the method taking advance of the bonding technology, has also a problem in that an excellent thermal conductivity of diamond cannot be fully exhibited since the thermal conductivity of the interface between the diamond layer and the silicon layer is extremely small.

SUMMARY OF THE INVENTION

The present invention was made in consideration of the above-described problems. Accordingly, it is an object of the present invention to provide a method for manufacturing a multilayered substrate for a semiconductor device, as well as a semiconductor device, the multilayered substrate exhibiting an excellent thermal conduction property and an excellent heat spreading effect without occurrence of warp and deformation.

A method for manufacturing a multilayered substrate for a semiconductor device according to a first aspect of the present invention includes the steps of forming a diamond layer on one surface of a first silicon substrate, forming a silicon-containing layer on the above-described diamond layer, bonding the above-described diamond layer to a second silicon substrate with the above-described silicon-containing layer therebetween, removing the above-described first silicon substrate to expose a surface of the above-described diamond layer, and forming a semiconductor layer on the above-described diamond layer.

In the present invention, the diamond layer disposed on the first silicon substrate is bonded to the second silicon substrate, the first silicon substrate is removed and, thereafter, the semiconductor layer is formed on the surface of the resulting exposed diamond layer, in contrast to the known bonding method in which the semiconductor layer is bonded to the diamond layer and, thereafter, the substrate on the semiconductor layer side is removed. Consequently, the thermal conductivity of the interface between the diamond layer and the semiconductor layer can be improved and, in addition, the thickness of the semiconductor layer can easily be controlled. Since the surface of the diamond layer as it is formed becomes the surface to be bonded to the second silicon substrate, roughness of the surface do not exert an influence on the semiconductor layer, and exert an effect of further improving the bonding strength. Since the surface on the first silicon substrate side of the diamond layer is flat, a semiconductor layer having a flat surface can be formed. Since the first silicon substrate is removed after bonding, even when contamination by heavy metals, alkali metals, and the like occurs during formation of the diamond layer, the semiconductor layer is not influenced. Furthermore, since the thickness of the first silicon substrate is not specifically limited, occurrence of warp and deformation can be suppressed by making the thickness of the first silicon substrate adequately thick relative to the diamond layer. As a result, a multilayered substrate for a semiconductor device can be produced, the multilayered substrate exhibiting an excellent thermal conduction property and an excellent heat spreading effect without occurrence of warp and deformation.

The above-described diamond layer may be formed locally. In this manner, separation can easily be conducted after the elements are formed on the semiconductor layer. In that case, the above-described semiconductor layer may also be formed on a region not bonded to the above-described diamond layer disposed locally. In this manner, a high-quality semiconductor layer can be formed.

The above-described diamond layer may be bonded to the above-described second silicon substrate with a silicon oxide layer or an amorphous silicon layer therebetween. In that case, the above-described silicon oxide layers or the above-described amorphous silicon layers may be disposed on both bonding surfaces of the above-described diamond layer and the above-described second silicon substrate. Alternatively, the silicon oxide layer may be disposed on a bonding surface of any one of the above-described diamond layer and the above-described second silicon substrate, the amorphous silicon layer may be disposed on a bonding surface of the other, and the above-described diamond layer may be bonded to the above-described second silicon substrate with the above-described silicon oxide layer and the above-described amorphous silicon layer therebetween.

The above-described first silicon substrate may be removed by polishing through the use of a liquid in which colloidal silica is mixed into an amine based aqueous solution so as to expose the surface of the above-described diamond layer, or the above-described second silicon substrate may be coated with silicon nitride (SiN) and, thereafter, the above-described first silicon substrate may be removed by being dissolved into a hydrofluoric acid based solution so as to expose the surface of the above-described diamond layer.

The method according to the first aspect may includes the steps of forming locally the above-described diamond layer on the above-described first silicon substrate, forming the above-described amorphous silicon layers on the above-described diamond layer and the above-described first silicon substrate and, in addition, forming the above-described silicon oxide layer on the above-described second silicon substrate, bonding the above-described diamond layer to the above-described second silicon substrate with the above-described amorphous silicon layer and the above-described silicon oxide layer therebetween, removing the above-described first silicon substrate by polishing while the above-described polishing treatment is stopped at the point in time when a surface of the above-described diamond layer is exposed partially, removing the above-described amorphous silicon layer by etching with an alkali solution through the use of the above-described silicon oxide layer as a stop layer, removing the above-described silicon oxide layer by etching with a solution containing hydrofluoric acid, forming locally a multilayered film composed of the above-described silicon oxide layer, the above-described amorphous silicon layer, and the above-described diamond layer on the above-described second silicon substrate, and forming the above-described semiconductor layer on the above-described diamond layer that is the uppermost layer of the above-described multilayered film and on the region where the above-described multilayered film is not present on the above-described second silicon substrate.

When the bonding is conducted by interposing the above-described silicon oxide layer and/or the above-described amorphous silicon layer, the above-described diamond layer may be bonded to the above-described second silicon substrate by thermal compression bonding. In this manner, the diamond layer can easily be bonded to the second silicon substrate and, in addition, an excellent bonding strength can be attained.

The above-described diamond layer may be formed from electrically conductive diamond doped with a dopant. In this manner, the diamond layer can serve as a current flow path and a wiring portion in combination.

The above-described semiconductor layer is, for example, a silicon layer, and an element is formed on the semiconductor layer.

A semiconductor device according to a second aspect of the present invention includes the multilayered substrate produced by the above-described method. In the present aspect, since the multilayered substrate to be used for a semiconductor device is produced by the above-described method and exhibits an excellent thermal conduction property and an excellent heat spreading effect without occurrence of warp and deformation, a semiconductor device exhibiting higher operation frequency and higher packaging density can be produced.

According to the present invention, the silicon substrate provided with the diamond layer is bonded to another silicon substrate with a silicon-containing layer therebetween, the silicon substrate on the diamond layer side is removed, and the semiconductor layer is formed on a surface of the resulting exposed diamond layer. Therefore, a multilayered substrate for a semiconductor device and a semiconductor device including the same can be produced, wherein the multilayered substrate exhibits an excellent thermal conduction property and an excellent heat spreading effect without occurrence of warp and deformation.

BRIEF DESCRIPTION OF THE DRAWINGS

FIG. 3A shows a step following the steps shown in FIGS. 2C and 2E.

FIG. 6A shows a step following the steps shown in FIGS. 5D and 5F.

DESCRIPTION OF THE PREFERRED EMBODIMENTS

Figure 1:
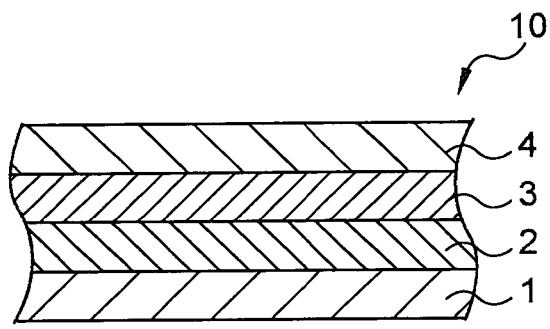
FIG. 1 is a sectional view schematically showing the structure of a multilayered substrate according to a first embodiment of the present invention.

The embodiments of the present invention will be specifically described below with reference to the attached drawings. A multilayered substrate according to the first embodiment of the present invention will be described. FIG. 1 is a sectional view schematically showing the multilayered substrate of the present embodiment. In a multilayered substrate 10 of the present embodiment, a silicon oxide ($SiO_2$) layer 2 is disposed on a surface of a silicon substrate 1, and a diamond layer 3 serving as a heat spreader and a silicon layer 4 serving as a semiconductor layer are disposed on this $SiO_2$ layer 2 in that order.

Figure 2A:
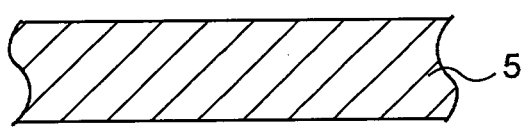
FIGS. 2A to 2E are sectional views showing a method for manufacturing a multilayered substrate according to the first embodiment of the present invention.

A method for manufacturing this multilayered substrate 10 will be described below. FIGS. 2A to 2E and FIGS. 3A to 3C are sectional views showing the method for manufacturing a multilayered substrate according to the present embodiment. As shown in FIG. 2A, a first silicon substrate 5 having a diameter of, for example, 100 mm and a thickness of, for example, 1 mm is prepared. As shown in FIG. 2B, a diamond layer 3 having a thickness of, for example, 15 μm is formed on one principal surface of the first silicon substrate 5 by a microwave CVD method. For the film formation condition thereof, for example, the substrate temperature is specified to be 800° C., and a mixed gas of hydrogen and methane is used as a material gas. At that time, a diborane ($B_2H_6$) gas is added to the material gas and, thereby, electrical conductivity can be imparted to the diamond layer 3. Subsequently, as shown in FIG. 2C, a surface of the diamond layer 3 is exposed to a mixed gas of a silane ($SiH_4$) gas and a hydrogen ($H_2$) gas under the temperature condition of, for example, 400° C. to produce polysilicon on the diamond layer 3 by vapor-phase growth, so that a polysilicon film 6 having a thickness of, for example, 200 nm is formed.

Figure 2D:
Figure 2B:
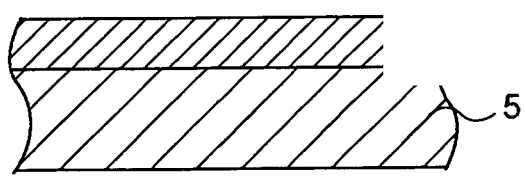
Figure 2E:
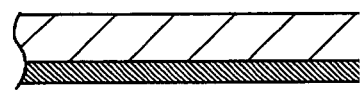
Figure 2C:
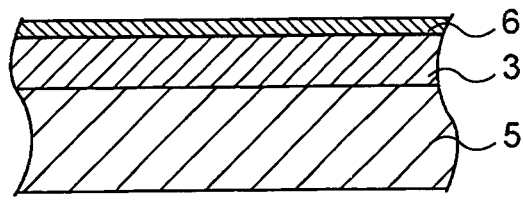

As shown in FIG. 2D, a second silicon substrate 1 having a diameter of, for example, 100 mm and a thickness of, for example, 0.5 mm is prepared. As shown in FIG. 2E, a $SiO_2$ film 7 is formed on one surface of the second silicon substrate 1 by a thermal oxidation method. For the condition at that time, the heat treatment temperature is, for example, 900° C. to 1,100° C., and the heat treatment time is, for example, 2 hours. The $SiO_2$ film can also be formed by growing boro-phospho-silicate glass (BPSG) on one surface of the second silicon substrate 1 and subjecting this to reflow, other than the thermal oxidation method. At that time, a mixed gas of tetraethoxysilane (TEOS: $Si(OC_2H_5)_4$), oxygen ($O_2$), trimethylphosphorous (TMP: $(CH_3)_3P$), and trimethylboron (TMB: $(CH_3)_3B$) is used as a material gas, the substrate temperature is maintained at 400° C., and BPSG is grown for about 60 seconds, so that a BPSG film having a thickness of, for example, 1 μm is formed on the second silicon substrate 1 by a plasma CVD method. Thereafter, the second silicon substrate 1 provided with the BPSG film is subjected to reflow by being maintained in a $N_2$ gas atmosphere for 30 minutes under a temperature condition of, for example, 900° C. In this manner, a $SiO_2$ film having a flat surface can be formed on the diamond layer 3.

Figure 3A:
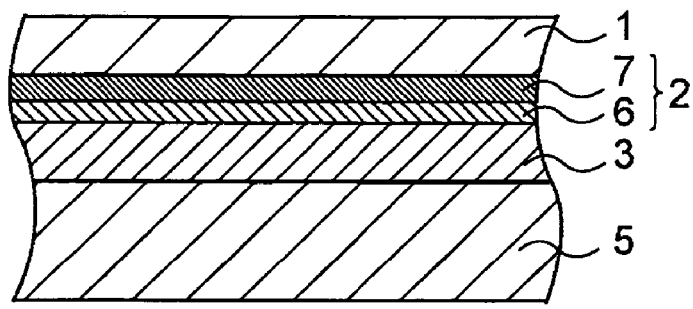
FIGS. 3A to 3C are sectional views showing a method for manufacturing a multilayered substrate, in order of the procedure, according to the first embodiment of the present invention.
Figure 3B:
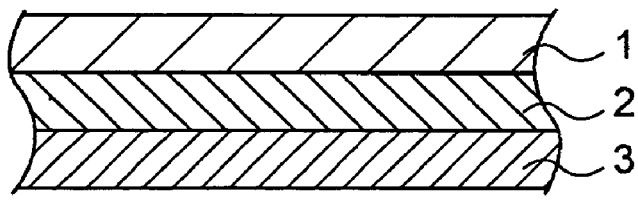
Figure 3C:
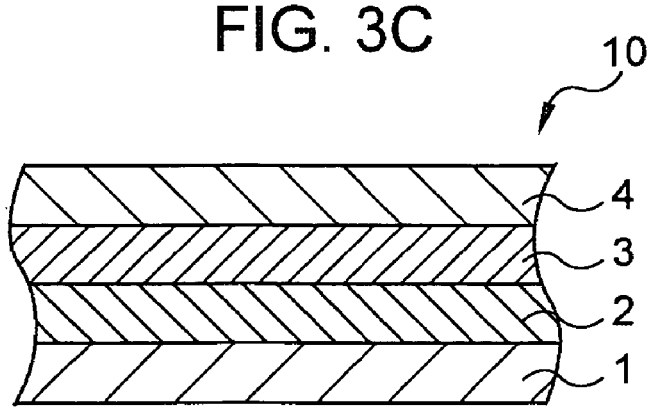

As shown in FIG. 3A, the second silicon substrate 1 is bonded to the first silicon substrate 5. Specifically, the second silicon substrate 1 and the first silicon substrate 5 are stacked while the polysilicon film 6 and the $SiO_2$ film 7 are faced each other. They are press-contacted, and heating is conducted under the temperature condition of 800° C. to 900° C. for 20 minutes so as to press-bond the second silicon substrate 1 and the first silicon substrate 5. Alternatively, the second silicon substrate 1 can also be bonded to the first silicon substrate 5 by, for example, applying a pulse voltage of about 300 V under the temperature condition of 100° C., other than the press bonding. As shown in FIG. 3B, for example, the first silicon substrate 5 is removed by polishing through the use of a liquid in which colloidal silica is mixed into an amine based aqueous solution so as to expose a surface of the diamond layer 3. In this manner, only the first silicon substrate 5 can be removed by polishing since the polishing speed and the chemical resistance of diamond are significantly different from those of silicon. In order to make assurance double sure, the surface of the above-described diamond layer may be exposed by removing the first silicon substrate 5 through dissolution with a hydrofluoric acid based solution after the second silicon substrate 1 is covered with, for example, silicon nitride (SiN). As shown in FIG. 3C, a silicon layer 4 serving as a semiconductor layer is formed on the diamond layer 3 by a CVD method, so that a multilayered substrate 10 is produced.

This multilayered substrate 10 may serve as a semiconductor device incorporating an integrated circuit when a semiconductor circuit is formed on the silicon layer 4 by a usual process.

In the method for manufacturing the multilayered substrate 10 of the present embodiment, after the first silicon substrate 5 is bonded to the second silicon substrate 1 by bringing the polysilicon film 6 and the $SiO_2$ film 7 into press-contact with each other, the first silicon substrate 5 is removed, and the silicon layer 4 is formed directly on the surface of the resulting exposed diamond layer 3. Therefore, the thermal conductivity of the interface between the diamond layer 3 and the semiconductor layer 4 can be improved and, in addition, the thickness of the silicon layer 4 can easily be controlled by changing the film formation time.

In the film formation, the surface of the diamond layer 3 is on the second silicon substrate 1 side, and the silicon layer 4 is formed on the flat surface on the first silicon substrate 5 side. Consequently, even when roughness is formed on the surface in the film formation, the shape of the silicon layer 4 is not influenced, and the silicon layer 4 having a flat surface can be formed. The roughness formed on the surface (the surface on the second silicon substrate 1 side) of the diamond layer 3 in the film formation functions advantageously in the bonding to the second silicon substrate 1.

Furthermore, since the first silicon substrate 5 is removed after bonding, even when the first silicon substrate 5 is contaminated by heavy metals, alkali metals, and the like during the film formation of the diamond layer 3, the silicon layer 4 is not influenced. The diamond layer 3 itself is resistant to being contaminated by impurities, and even when impurities are taken in, the resulting impurities are not eluted. Therefore, high-purity and high-quantity silicon layer 4 can be formed. In addition, since the thickness of the silicon substrate 5 is not specifically limited, occurrence of warp and deformation can be prevented during the film formation of the diamond layer 3 by using the first silicon substrate 5 having a thickness adequately large relative to the thickness of the diamond layer 3. As a result, a multilayered substrate for a semiconductor device can be produced, the multilayered substrate exhibiting an excellent thermal conduction property and an excellent heat spreading effect and including a high-quality silicon layer serving as a semiconductor layer without occurrence of warp and deformation.

Figure 4:
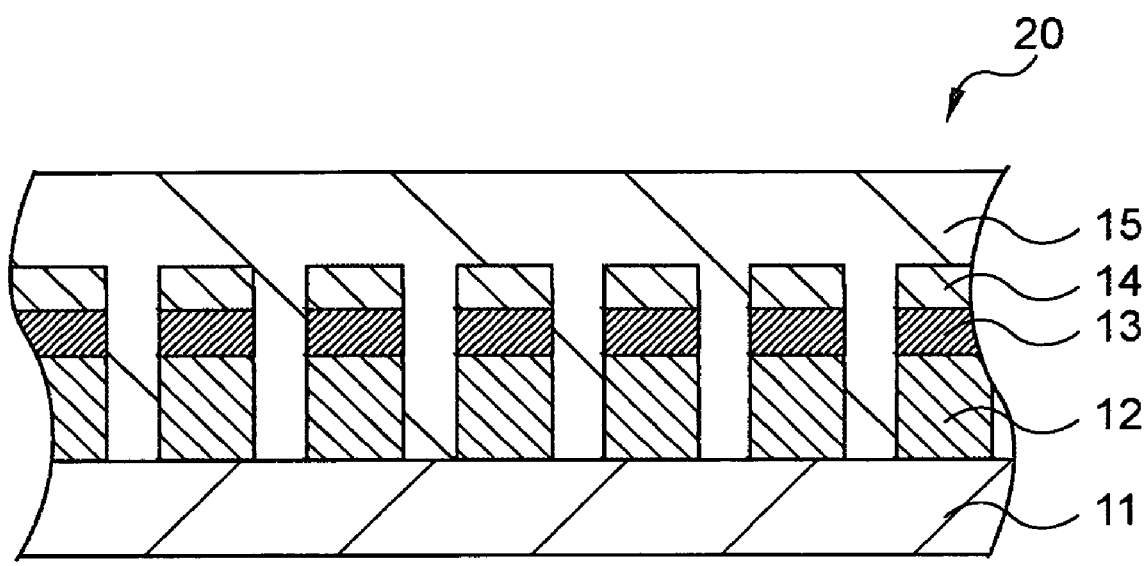
FIG. 4 is a sectional view schematically showing the structure of a multilayered substrate according to a second embodiment of the present invention.

A multilayered substrate according to the second embodiment of the present invention will be described below. FIG. 4 is a sectional view schematically showing the structure of the multilayered substrate of the present embodiment. In the multilayered substrate 20 of the present embodiment, a $SiO_2$ layer 12 is disposed locally on one principal surface of a silicon substrate 11 made of single crystal silicon, an amorphous silicon layer 13 and a diamond layer 14 are disposed in that order on the $SiO_2$ layer 12, and a silicon layer 15 serving as a semiconductor layer is further disposed covering the one principal surface of the silicon layer 11 and the diamond layer 14.

Figure 5A:
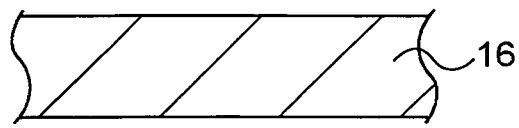
FIGS. 5A to 5F are sectional views showing a method for manufacturing a multilayered substrate according to the second embodiment of the present invention.

A method for manufacturing the multilayered substrate 20 of the present embodiment will be described below. FIGS. 5A to 5F and FIGS. 6A to 6C are sectional views showing the method for manufacturing a multilayered substrate according to the present embodiment. As shown in FIG. 5A, a first silicon substrate 16 having a diameter of, for example, 150 mm and a thickness of, for example, 2 mm is prepared. As shown in FIG. 5B, a diamond layer 14 having a thickness of, for example, 25 μm is formed on one principal surface of the first silicon substrate 16 by a microwave CVD method as in the above-described first embodiment. For the film formation condition thereof, the substrate temperature is specified to be, for example, 800° C., and a mixed gas of hydrogen and methane is used as a material gas. At that time, a diborane ($B_2H_6$) gas is added to the material gas and, thereby, electrical conductivity can be imparted to the diamond layer 14.

Figure 5E:
Figure 5B:
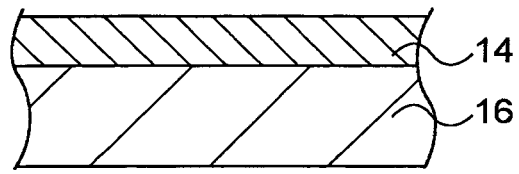
Figure 5F:
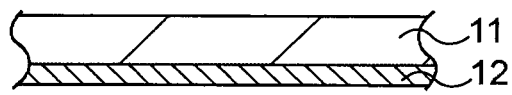
Figure 5C:
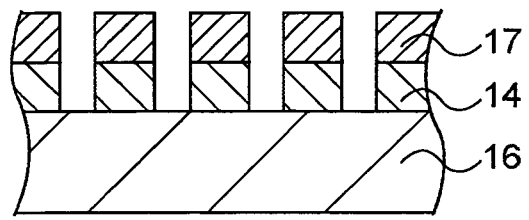

Subsequently, as shown in FIG. 5C, an aluminum mask 17 having a thickness of 200 nm is formed through patterning on the surface of the diamond layer 14 by usual photolithography, and the diamond layer 14 is ion-etched by using this aluminum mask 17 as a mask. Specifically, the aluminum mask 17 is formed on a region to be provided with an element when the multilayered substrate 20 is completed (predetermined element-forming region), reactive ion etching is conducted in an oxygen-containing atmosphere to remove the diamond layer 14 in the region other than the predetermined element-forming region, so that a principal surface of the first silicon substrate 16 is exposed partially. In the reactive ion etching step, an extremely thin $SiO_2$ layer (not shown in the drawing) is formed on the portion at which the principal surface of the first silicon substrate 16 is exposed. Subsequently, the aluminum mask is removed by, for example, an aqua regia treatment.

Figure 5D:
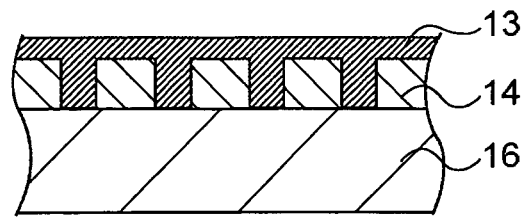

As shown in FIG. 5D, an amorphous silicon layer 13 is formed on the principal surface of the first silicon substrate 16 by, for example, a CVD method or sputtering evaporation, in such a way that covers the diamond layer 14.

On the other hand, as shown in FIG. 5E, a single crystal silicon substrate (second silicon substrate) 11 having a diameter of, for example, 150 mm and a thickness of, for example, 0.6 mm is prepared. As shown in FIG. 5F, a mixed gas of a TEOS gas and an $O_2$ gas is introduced on one surface of this single crystal silicon substrate (second silicon substrate) 11 under the temperature condition of, for example, about 400° C. and, thereby, vapor phase deposition of $SiO_2$ is effected on the one surface of the second silicon substrate 11, so that a $SiO_2$ layer 12 having a thickness of, for example, 200 nm is formed.

Figure 6A:
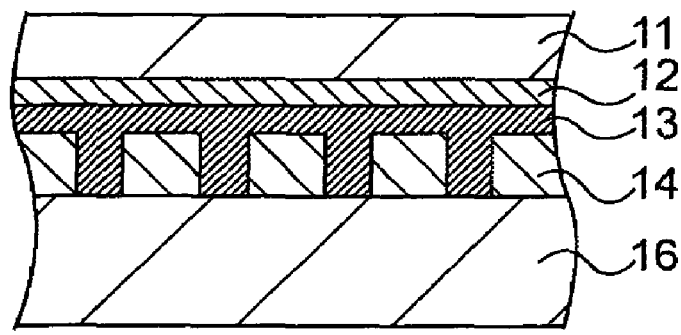
FIGS. 6A to 6C are sectional views showing a method for manufacturing a multilayered substrate, in order of the procedure, according to the second embodiment of the present invention.
Figure 6B:
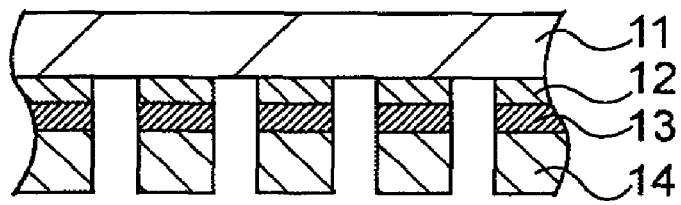

As shown in FIG. 6A, in a manner similar to that in the above-described first embodiment, the $SiO_2$ layer 12 of the second silicon substrate 11 and the amorphous silicon layer 13 of the first silicon substrate 16 are press-bonded. Thereafter, as shown in FIG. 6B, the first silicon substrate 16 is removed and, in addition, the amorphous silicon layer 13 and the $SiO_2$ layer 12 are removed from the portion where the diamond layer 14 is not disposed. The removal step in the method for manufacturing the multilayered substrate 20 of the present embodiment is not easy as compared with the step of removing the silicon substrate 5 in the method for manufacturing the multilayered substrate 10 of the above-described first embodiment. Specifically, the first silicon substrate 16 is roughly removed by polishing, and the polishing treatment is stopped at the point in time when the surface of the diamond layer 14 is exposed partially. The amorphous silicon layer 13 is removed by etching with an alkali solution, e.g., potassium hydroxide (KOH), through the use of the $SiO_2$ layer 12 as a stop layer. Subsequently, the $SiO_2$ layer 12 is removed by etching with a solution containing hydrofluoric acid. In this manner, the multilayered substrate 20 is produced, in which a multilayered film composed of the $SiO_2$ layer 12, amorphous silicon layer 13, and the diamond layer 14 is disposed locally on the second silicon substrate 11.

Figure 6C:
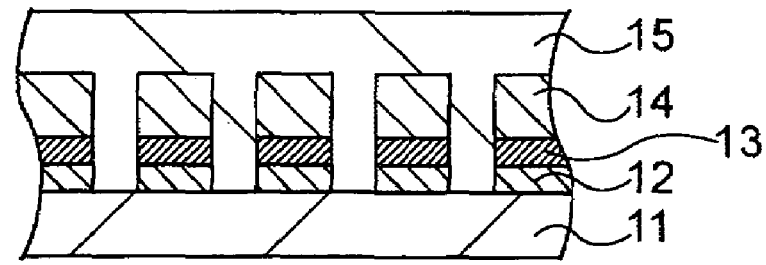
Figure 7A:
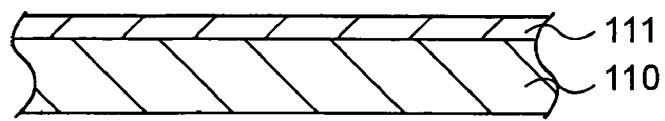
FIGS. 7A to 7E are sectional views showing a known method for manufacturing a multilayered structure in order of the procedure (Prior Art).
Figure 7B:
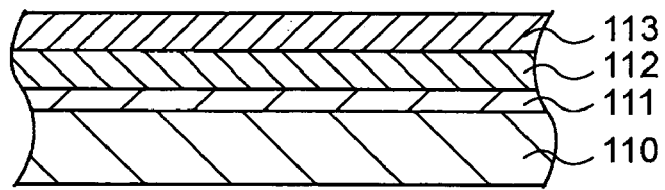
Figure 7C:
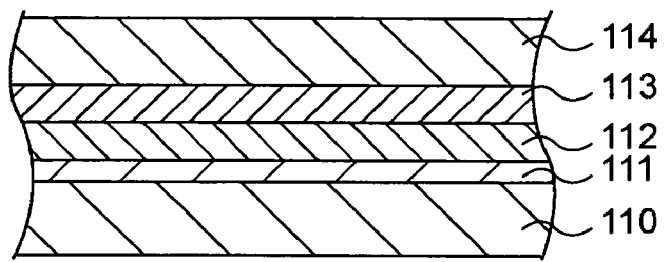
Figure 7D:
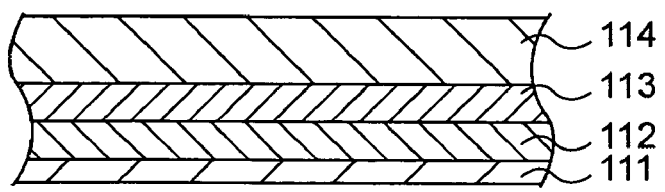
Figure 7E:
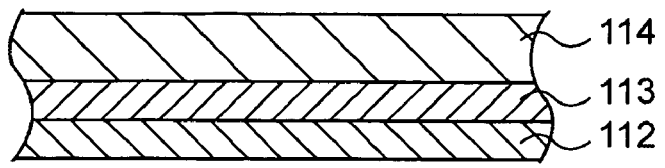

As shown in FIG. 6C, by a CVD method, single crystal silicon is epitaxially grown on an exposed portion of the one surface of the second silicon substrate 11 by flowing dichlorosilane ($SiH_2Cl_2$) together with a $H_2$ gas at a substrate temperature of, for example, 650° C., so that a silicon layer 15 serving as a semiconductor layer is formed covering the one surface of the second silicon substrate 11 and the diamond layer 14.

This multilayered substrate 20 may serve as a semiconductor device incorporating an integrated circuit when a semiconductor circuit is formed on the silicon layer 15 by a usual process.

In the method for manufacturing the multilayered substrate 20 of the present embodiment, after the first silicon substrate 16 is bonded to the second silicon substrate 11 by bringing the amorphous silicon layer 13 and the $SiO_2$ film 12 into press-contact with each other, the first silicon substrate 16 is removed, and the silicon layer 15 is formed on the surface of the resulting exposed diamond layer 14. Therefore, the thermal conductivity of the interface between the diamond layer 14 and the silicon layer 15 can be improved and, in addition, the thickness of the silicon layer 15 can easily be controlled.

In the film formation, since the surface on the silicon substrate 1 side of the diamond layer 14 has roughness, the shape of the silicon layer 4 is not influenced, and surface roughness functions advantageously in the bonding to the second silicon substrate 1. On the other hand, the surface on the silicon substrate 5 side of the diamond layer 14 is flat, and the silicon layer 15 is formed on this flat surface. Consequently, the silicon layer 15 can have a flat surface.

Furthermore, since the first silicon substrate 16 is removed after bonding, even when the first silicon substrate 16 is contaminated by heavy metals, alkali metals, and the like during the film formation of the diamond layer 14, the film formation of the silicon layer 15 is not influenced. In addition, since the thickness of the silicon substrate 16 is not specifically limited, the thickness of the first silicon substrate 16 can be made adequately large relative to the thickness of the diamond layer 14. Consequently, occurrence of warp and deformation can be prevented during the film formation of the diamond layer 14.

The amorphous silicon layer 13 and the $SiO_2$ layer 12 in the region provided with no diamond layer 14 are removed so as to expose the surface of the second silicon substrate 11, and silicon is epitaxially grown on this single crystal silicon substrate 11. Consequently, a high-quality silicon layer 15 can be formed. Since the multilayered substrate 20 produced by this method includes the diamond layer 14 formed locally, elements can easily be separated when semiconductor devices are produced.

The present invention can be applied to substrates for high-speed/high-density semiconductor devices.

What is claimed is:

1. A method for manufacturing a multilayered substrate for a semiconductor device comprising:
    forming locally a diamond layer on a first silicon substrate;
    forming an amorphous silicon layer on the diamond layer and the first silicon substrate and forming a silicon oxide layer on a second silicon substrate;
    bonding the diamond layer to the second silicon substrate with the amorphous silicon layer and the silicon oxide layer therebetween;
    removing the first silicon substrate by polishing while the polishing treatment is stopped when a surface of the diamond layer is exposed partially;
    removing the amorphous silicon layer by etching with an alkali solution through using the silicon oxide layer as a stop layer;
    removing the silicon oxide layer by etching with an solution containing hydrofluoric acid thereby forming locally a multilayered film composed of the silicon oxide layer, the amorphous silicon layer, and the diamond layer on the second silicon substrate; and
    forming a semiconductor layer on the diamond layer that is the uppermost layer of the multilayered film and on the region where the multilayered film is not present on the second silicon substrate.

2. The method for manufacturing a multilayered substrate for a semiconductor device according to claim 1, wherein:
    the first silicon substrate is removed by polishing through the use of a liquid in which colloidal silica is mixed into an amine based aqueous solution so as to expose a surface of the diamond layer; or
    the second silicon substrate is coated with silicon nitride (SiN) and, thereafter, the first silicon substrate is removed by being dissolved into a hydrofluoric acid based solution so as to expose a surface of the diamond layer.

3. The method for manufacturing a multilayered substrate for a semiconductor device according to claim 1, wherein the diamond layer is bonded to the second silicon substrate by thermal compression bonding.

4. The method for manufacturing a multilayered substrate for a semiconductor device according to claim 1, wherein the diamond layer is formed from electrically conductive diamond doped with a dopant.

5. The method for maufacturing a multilayered substrate for a semiconductor device according to claim 1, wherein the semiconductor layer is a silicon layer, and an element is formed on the semiconductor layer.

* * * * *